US009105500B2

(12) United States Patent
Bodenweber et al.

(10) Patent No.: US 9,105,500 B2
(45) Date of Patent: Aug. 11, 2015

(54) NON-HERMETIC SEALED MULTI-CHIP MODULE PACKAGE

(75) Inventors: Paul F. Bodenweber, Kingston, NY (US); Hilton T. Toy, Hopewell Junction, NY (US); Krishna R. Tunga, Wappingers Falls, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 13/548,232

(22) Filed: Jul. 13, 2012

(65) Prior Publication Data

US 2014/0015387 A1      Jan. 16, 2014

(51) Int. Cl.
| H05K 5/02 | (2006.01) |
| H01L 23/10 | (2006.01) |
| H01L 21/50 | (2006.01) |
| H01L 23/40 | (2006.01) |

(52) U.S. Cl.
CPC ............... *H01L 23/10* (2013.01); *H01L 21/50* (2013.01); *H01L 23/40* (2013.01); *H01L 2924/0002* (2013.01); *Y10T 29/49822* (2015.01)

(58) Field of Classification Search
USPC ........................................................ 257/704
IPC ........................................................ H01L 23/40
See application file for complete search history.

(56) References Cited

U.S. PATENT DOCUMENTS

| 5,182,632 | A | * | 1/1993 | Bechtel et al. | ................. | 257/713 |
| 5,608,610 | A | * | 3/1997 | Brzezinski | ..................... | 361/704 |
| 6,144,013 | A | * | 11/2000 | Chu et al. | ....................... | 219/209 |
| 6,168,452 | B1 | | 1/2001 | Lai et al. | | |
| 6,274,214 | B1 | | 8/2001 | Chan et al. | | |
| 6,342,407 | B1 | | 1/2002 | Goldmann et al. | | |
| 6,404,638 | B1 | | 6/2002 | Messina | | |
| 6,459,160 | B1 | | 10/2002 | Goldmann et al. | | |
| 6,497,582 | B1 | | 12/2002 | Hoffmeyer | | |
| 6,587,345 | B2 | * | 7/2003 | Chu et al. | ....................... | 361/719 |
| 6,627,997 | B1 | * | 9/2003 | Eguchi et al. | .................. | 257/777 |
| 6,629,363 | B1 | | 10/2003 | Chan | | |
| 6,853,071 | B2 | * | 2/2005 | Yoshikawa | ..................... | 257/717 |
| 6,953,985 | B2 | | 10/2005 | Lin et al. | | |
| 6,955,543 | B2 | | 10/2005 | Messina et al. | | |
| 6,972,958 | B2 | * | 12/2005 | Mayer | ........................... | 361/719 |
| 7,064,953 | B2 | * | 6/2006 | Miller | ........................... | 361/690 |
| 7,133,286 | B2 | * | 11/2006 | Schmidt et al. | ............... | 361/718 |
| 7,180,179 | B2 | | 2/2007 | Mok et al. | | |
| 7,323,775 | B2 | | 1/2008 | Wang | | |
| 7,462,506 | B2 | * | 12/2008 | Kuczynski | ....................... | 438/58 |
| 7,646,605 | B2 | | 1/2010 | Ciccaglione | | |
| 7,651,890 | B2 | * | 1/2010 | Goth et al. | .................... | 438/115 |
| 7,808,781 | B2 | * | 10/2010 | Colgan et al. | .................. | 361/699 |
| 7,826,228 | B2 | | 11/2010 | Audet et al. | | |
| 7,893,531 | B2 | | 2/2011 | Mitchell et al. | | |
| 7,936,060 | B2 | | 5/2011 | Andry et al. | | |
| 8,039,308 | B2 | | 10/2011 | Mitchell et al. | | |

(Continued)

*Primary Examiner* — Eugene Lee
(74) *Attorney, Agent, or Firm* — Cantor Colburn LLP; Steven Meyers

(57) ABSTRACT

A multi-chip module (MCM) package is provided and includes a substrate and a hat assembly. The substrate includes a surface on which chips of the MCM are re-workable. The hat assembly is configured to be non-hermetically sealed to the substrate. The hat assembly and the substrate are configured for tension-type disassembly in a dimension oriented substantially normally with respect to a plane of the substrate surface.

14 Claims, 4 Drawing Sheets

(56) References Cited

U.S. PATENT DOCUMENTS

| | | |
|---|---|---|
| 8,062,048 B2 | 11/2011 | Ma |
| 8,124,456 B2 | 2/2012 | Kinsley |
| 8,188,581 B2 | 5/2012 | Shi et al. |
| 2005/0037640 A1 | 2/2005 | Messina et al. |
| 2007/0075417 A1 | 4/2007 | Hwang et al. |
| 2010/0126008 A1 | 5/2010 | Kitamura et al. |

* cited by examiner

NON-HERMETIC SEALED MULTI-CHIP MODULE PACKAGE

BACKGROUND

The present invention relates to multi-chip modules, and more specifically, to a non-hermetic sealed multi-chip module package.

A multi-chip module (MCM) package is a specialized electronic package where multiple integrated circuits (ICs), semiconductor dies or other discrete components are packaged onto a unifying substrate, facilitating their combined use as a single component. The MCM itself will often be referred to as a "chip" in designs, thus illustrating its integrated nature. Multi-chip module packages come in a variety of forms depending on the complexity and development philosophies of their designers. These forms can range from using pre-packaged ICs on a small printed circuit board (PCB) meant to mimic the package footprint of an existing chip package to fully customized chip packages integrating many chip dies on a High Density Interconnection (HDI) substrate.

Since it is often necessary to conduct re-working operations on MCM packages, disassembly methods for MCM packages are typically considered as part of an overall design strategy. Previously two types of disassembly methods have been used. A first type employs mechanical disassembly in a vertical direction and a second type employs shear disassembly in a horizontal direction. The first type is complex and does not provide XY space for disassembly. The second type provides XY space for disassembly but requires that additional space, which is otherwise wasted, be provided for facilitating the shearing.

SUMMARY

According to one embodiment of the present invention, a multi-chip module (MCM) package is provided and includes a substrate and a hat assembly. The substrate includes a surface on which chips of the MCM are re-workable. The hat assembly is configured to be non-hermetically sealed to the substrate. The hat assembly and the substrate are configured for tension-type disassembly in a dimension oriented substantially normally with respect to a plane of the substrate surface.

According to another embodiment of the present invention, a multi-chip module (MCM) package is provided and includes a substrate including a surface on which chips of the MCM are re-workable and plugs disposed on the surface and a hat assembly including a sealband receptive of the plugs such that the hat assembly is configured to be non-hermetically sealed to the substrate and disassembled from the substrate in a dimension oriented substantially normally with respect to a plane of the substrate surface.

According to yet another embodiment of the present invention, a re-working method for a multi-chip module (MCM) package is provided. The package includes a substrate including a surface on which chips of the MCM are re-workable and a hat assembly configured to be non-hermetically sealed to the substrate. The method includes applying tension to disassemble the hat assembly and the substrate from one another in a dimension oriented substantially normally with respect to a plane of the substrate surface.

Additional features and advantages are realized through the techniques of the present invention. Other embodiments and aspects of are described in detail herein and are considered a part of the claimed invention. For a better understanding, refer to the description and to the drawings.

BRIEF DESCRIPTION OF THE SEVERAL VIEWS OF THE DRAWINGS

The subject matter which is regarded as the embodiments is particularly pointed out and distinctly claimed in the claims at the conclusion of the specification. The forgoing and other features, and advantages are apparent from the following detailed description taken in conjunction with the accompanying drawings in which:

DETAILED DESCRIPTION

Figure 1:
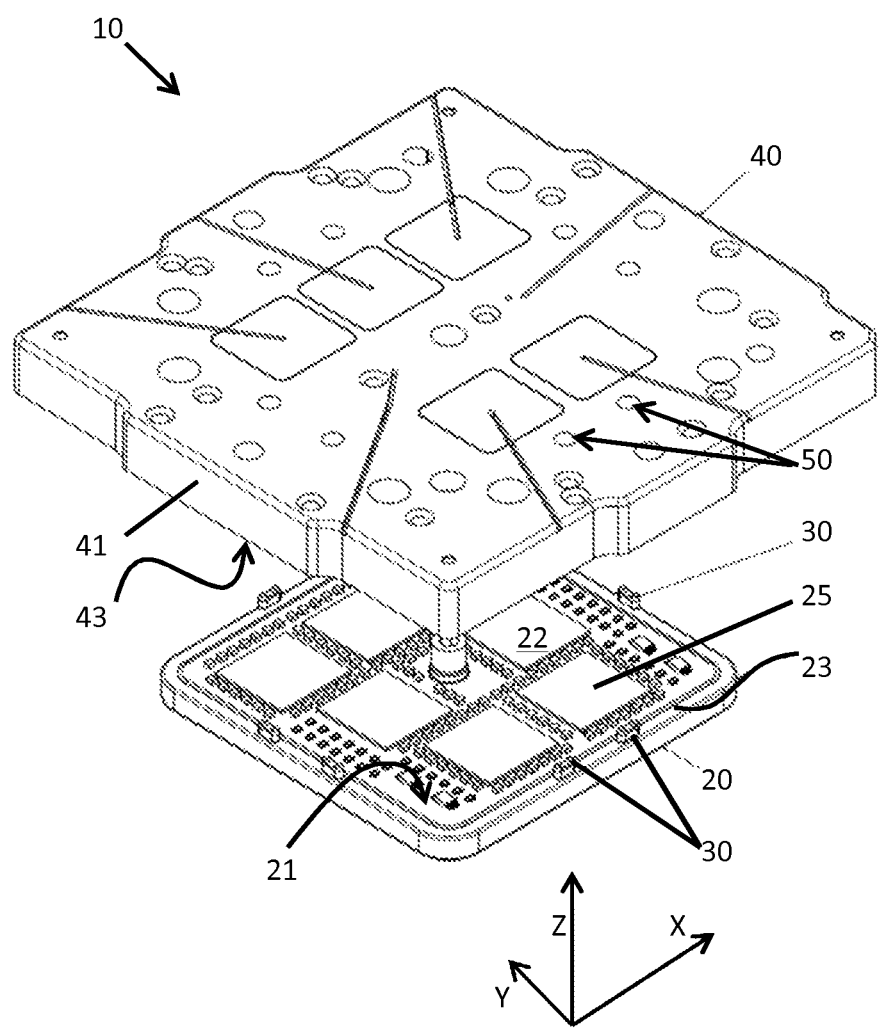
FIG. 1 is a perspective exploded view of a multi-chip module (MCM) package.

As multi-chip module (MCM) packages have become increasingly complex, the capability to conduct shear disassembly has become compromised. In accordance with aspects, a multi-chip module (MCM) package is provided. The MCM package includes a substrate and a hat assembly. The substrate includes a surface on which chips of the MCM are re-workable and the hat assembly is configured to be non-hermetically sealed to the substrate. The hat assembly and the substrate are configured for tension-type disassembly in a dimension oriented substantially normally with respect to a plane of the substrate surface.

Embodiments of the MCM package will now be described with reference to FIGS. 1-3. As shown, an MCM package 10 includes a substrate 20 and a hat assembly 40. The substrate 20 includes a surface 21, which is substantially planar in for example the X-Y dimensions, and plugs 30. The surface 21 includes a central portion 22 and an exterior portion 23 that surrounds the central portion 22. Chips 25 of the MCM package 10, such as processors or the like, are re-workable on the surface 21 in the central portion 22. The chips 25 may be arranged in various configurations. The plugs 30 are disposed on the surface 21 at the exterior portion 23.

Figure 2:
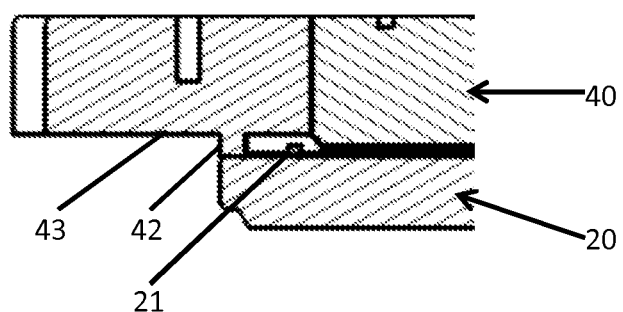
FIG. 2 is a plan view of a sealband of a hat assembly of the MCM package of FIG. 1.
Figure 3:
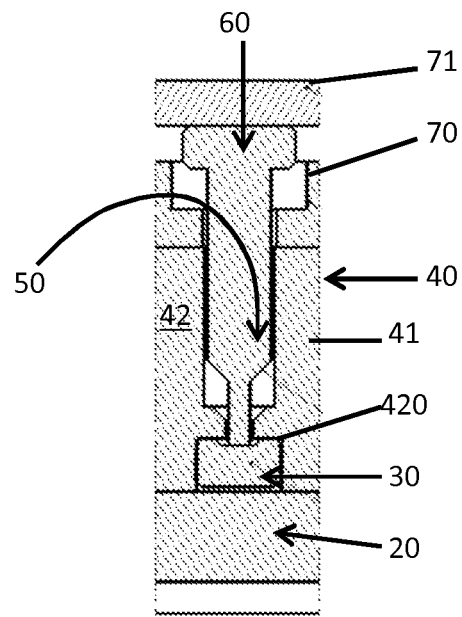
FIG. 3 is a cutaway view of the sealband of FIG. 2.

The hat assembly 40 includes a main body 41 and a sealband 42 (see FIGS. 2 and 3). The main body 41 has a surface 43 that complements the surface 21 of the substrate 20. The sealband 42 is disposed around the surface 43 to correspond generally with the dimensions of the exterior portion 23 of the surface 21 of the substrate 20. The sealband 42 is configured to be receptive of the plugs 30 (see FIG. 3) such that the hat assembly 40 is configured to be non-hermetically sealed to the substrate 20 and to be disassembled from the substrate 20 in a dimension that is oriented substantially normally with respect to a plane of the surface 21 of the substrate 20. That is, where the surface 21 is substantially planar in the exemplary X-Y dimensions, the disassembly is conducted in the Z dimension.

In accordance with further aspects, the disassembly is conducted in only the one dimension that is oriented substantially normally with respect to the plane of the surface 21 of the substrate. That is, where the surface 21 is substantially planar in the exemplary X-Y dimensions, the disassembly is conducted only in the Z dimension. As such, a need for otherwise wasted space required for shear disassembly may be eliminated, interface conditions may be preserved by the prevention of smearing of thermal interface material or seal material for qualification or return-from-field diagnostic purposes, component damage due to interference during the separation process may be prevented and module components (i.e., the module package and lid) may be preserved for reuse.

In accordance with embodiments, the substrate 20 may include at least one or more of a laminate structure and high performance glass ceramic (HPGC), the plugs 30 include compliant material or, more particularly, at least one or more of nylon and polyetherimide (PEI) and the sealband 42 may include silicone or a silicone based material, such as Dow Corning Sylgard™. The plug 30, being made from compliant material, will tend to minimize stress applied to or on the substrate 20 during disassembly processes. The plug 30 material also provides for good bonding to sealband 42 adhesive material for production, assembly or manufacture of a non-hermetic sealed MCM.

With reference to FIGS. 2 and 3, the plugs 30 are shaped to provide for an interference fit with the sealband 42. That is, in accordance with embodiments, the sealband 42 may be about 3 mm wide and the plugs 30 may be about 2 mm wide. The plugs 30 thus fit within appropriately sized recesses 420 defined in the sealband 42 (i.e., such that the plugs 30 and the sealband 42 form "plug and sealband interference fittings" at the recesses 420). The material of the plugs 30 and the material of the sealband 42 register with one another and facilitate maintenance of an attachment of the hat assembly 40 with the substrate 20.

Figure 4:
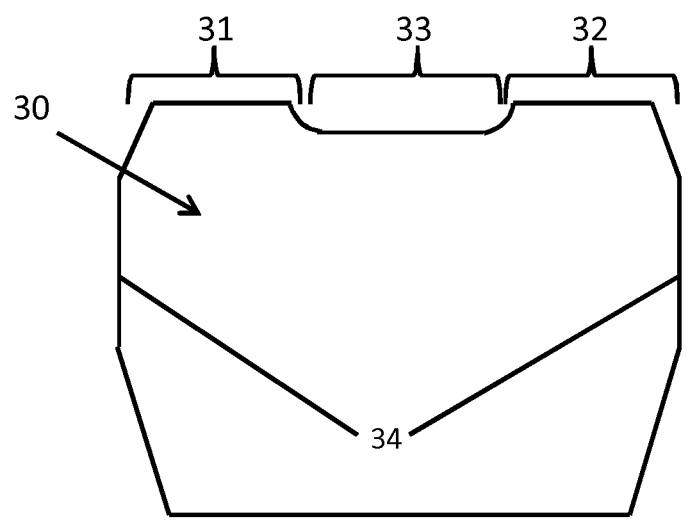
FIG. 4 is a plan view of a plug of the MCM package of FIG. 1.

With reference to FIG. 4, a cross-sectional shape of the plugs 30 may be "boat-like" with raised front and rear ends 31 and 32 and a recessed central portion 33. The recessed central portion 33 is configured to be impinged upon by a pin 60 (to be described below) during disassembly processes. Sidewalls 34 of the plugs 30 are generally planar and tightly fit against complementary sidewalls of the recesses 420 of the sealband 42.

As shown in FIG. 1, both the substrate 20 and the hat assembly 40 may be substantially square or, more generally, rectangular or polygonal in shape. Thus, each of the sealband 42 and the exterior portion 23 of the surface 21 of the substrate 20 may also be substantially square, rectangular or polygonal as the case may be. In this way, when the hat assembly 40 is non-hermetically sealed to the substrate 20, the sealband 42 aligns with the exterior portion 23 of the surface 21 such that the sealband 42 is sealably receptive of the plugs 30.

Regardless of the shape of the substrate 20 and the hat assembly 40, the plugs 30 may be evenly distributed about each side or edge of the substrate 20. That is, for the exemplary case in which the substrate 20 and the hat assembly 40 are substantially square, the plugs 30 may be substantially evenly distributed to each side of the substrate 20. In an embodiment, two plugs 30 may be distributed to each side of the substrate 20 for a total of 8 plugs 30 for the MCM package 10.

Figure 5:
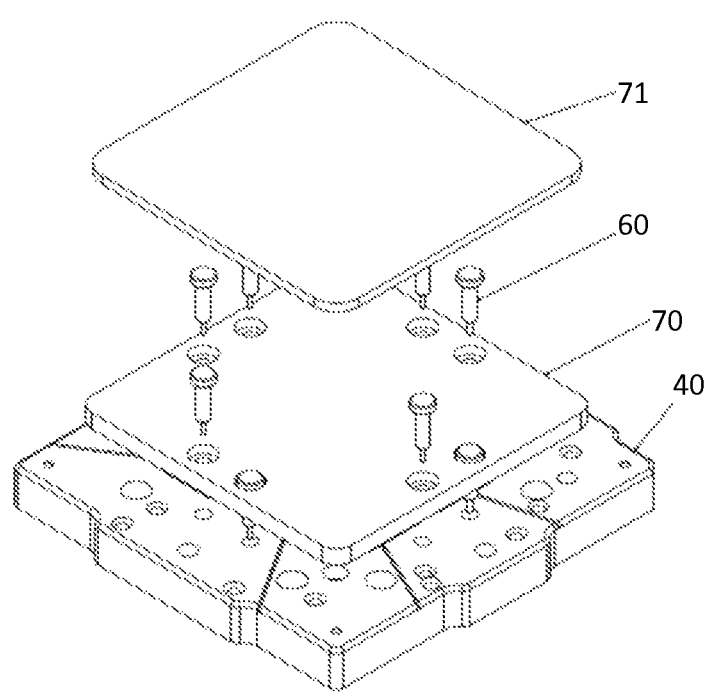
FIG. 5 is a diagram of a disassembly of and MCM package in accordance with embodiments.

With reference to FIGS. 1, 3 and 5, a re-working method for the MCM package 10 is provided. As shown in FIGS. 1 and 3, the main body 41 of the hat assembly 40 is formed to define plug holes 50 that correspond in location to each corresponding one of the plugs 30. Thus, when the hat assembly 40 and the substrate 20 are non-hermetically sealed, the plug holes 50 extend through the main body 41 to upper surfaces of the corresponding plugs 30 (see FIG. 3). As shown in FIGS. 3 and 5, pins 60 may be provided in locations corresponding to each of the plug holes 50 by a locating plate 70, which is disposed adjacent to the hat assembly 40 such that each of the pins 60 is received within a corresponding one of the through-holes 50.

Upon application of a substantially uniform pressure via push-plate 71, the pins 60 are thereby configured to push the plugs 30 away from the sealband 42. As this pressure may be applied by way of the push-plate 71, the pressure can be transmitted substantially evenly to each of the pins 60. In turn, the pressure can be transmitted via the pins 60 and the plugs 30 to the substrate 20 in a substantially even distribution. This even distribution of pressure to the substrate 20 avoids any risk of damage to the substrate caused by an uneven distribution of pressure thereto.

That is, as described above, since each of the pins 60, the plug holes 50 and the plugs 30 are substantially evenly distributed around the exterior portion 23 of the surface 21 of the substrate 20, pressure or loads applied to the push-plate 71/locating plate 70/pins 60 can be transmitted substantially evenly to the exterior portion 23 of the surface 21 of the substrate 20. Thus, damage to the substrate 20 due to uneven or locally excessive pressure or loads can be avoided. Indeed, for a case in which 8 plugs 30 are employed, it has been found that an amount of pressure required to be applied to each of the plugs 30 to cause disassembly of the hat assembly 40 from the substrate 20 is, in sum, substantially less than an amount of pressure at which substrate failure would be expected to occur.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the form disclosed. Many modifications and variations will be apparent to those of ordinary skill in the art. The embodiments were chosen and described in order to best explain the principles of the embodiments and their practical application, and to enable others of ordinary skill in the art to understand the various embodiments with various modifications as are suited to the particular use contemplated.

The flow diagrams depicted herein are just one example. There may be many variations to this diagram or the steps (or operations) described therein without departing from the spirit of the embodiments. For instance, the steps may be performed in a differing order or steps may be added, deleted or modified. All of these variations are considered a part of the claimed invention.

While embodiments have been described, it will be understood that those skilled in the art, both now and in the future, may make various improvements and enhancements which fall within the scope of the claims which follow. These claims should be construed to maintain the proper protection.

What is claimed is:

1. A multi-chip module (MCM) package, comprising:
a substrate including a surface on which chips of the MCM are re-workable; and
a hat assembly configured to be non-hermetically sealed to the substrate;
a plurality of evenly arrayed plug and sealband interference fittings by which the substrate and the hat assembly are non-hermetically sealed to one another,
the hat assembly being formed to define holes positionally corresponding to the fittings, and
the hat assembly and the substrate being configured for tension-type disassembly from a non-hermetic sealed condition by a pushing force sufficient to undo the fittings that is directed evenly onto each of the fittings from within each of the holes in a dimension oriented substantially normally with respect to a plane of the substrate surface.

2. The MCM package according to claim 1, wherein the substrate comprises high performance glass ceramic (HPGC).

3. The MCM package according to claim 1, wherein the substrate and the hat assembly are substantially square, rectangular or polygonal.

4. The MCM package according to claim 1, wherein tension applied for the tension-type disassembly is distributed substantially evenly to each side of the substrate.

5. A multi-chip module (MCM) package, comprising:
a substrate including a surface on which chips of the MCM are re-workable and plugs disposed on the surface; and
a hat assembly including a sealband defining recesses positionally corresponding to and receptive of the plugs, the hat assembly defining holes positionally corresponding to the recesses,
wherein the plugs are shaped for interference fitting within the recesses such that the hat assembly is configured to be non-hermetically sealed to the substrate and disassembled from the substrate by a pushing force sufficient to remove the plugs from the recesses that is directed evenly onto each of the plugs from within each of the holes in a dimension oriented substantially normally with respect to a plane of the surface.

6. The MCM package according to claim 5, wherein the substrate comprises high performance glass ceramic (HPGC).

7. The MCM package according to claim 5, wherein the plugs comprise compliant material.

8. The MCM package according to claim 5, wherein the plugs comprise nylon and polyetherimide (PEI).

9. The MCM package according to claim 5, wherein the sealband comprises silicone.

10. The MCM package according to claim 5, wherein the substrate and the hat assembly have substantially square, rectangular or polygonal shapes.

11. The MCM package according to claim 10, wherein the plugs are evenly distributed to each side of the substrate.

12. The MCM package according to claim 10, wherein two plugs are distributed to each side of the substrate.

13. The MCM package according to claim 5, wherein the sealband is about 3 mm wide and the plugs are about 2 mm wide.

14. The MCM package according to claim 5, further comprising:
pins disposable in the holes, the pins being configured to apply the pushing force onto each of the plugs from within each of the holes; and
a push-plate disposable to contact each of the pins in each of the holes by which a pressing force is applicable to the pins to generate the pushing force.

* * * * *